US012777745B2

(12) United States Patent
Wu et al.

(10) Patent No.: US 12,777,745 B2
(45) Date of Patent: Oct. 27, 2026

(54) LIGHT-EMITTING DEVICE AND METHOD FOR MANUFACTURING THE SAME

(71) Applicant: TIANJIN SANAN OPTOELECTRONICS CO., LTD., Tianjin (CN)

(72) Inventors: Zhiwei Wu, Tianjin (CN); Yanyun Wang, Tianjin (CN); Di Gao, Tianjin (CN); Liguo Zhang, Tianjin (CN); Weiping Xiong, Tianjin (CN)

(73) Assignee: TIANJIN SANAN OPTOELECTRONICS CO., LTD., Tianjin (CN)

( * ) Notice: Subject to any disclaimer, the term of this patent is extended or adjusted under 35 U.S.C. 154(b) by 481 days.

(21) Appl. No.: 18/346,472

(22) Filed: Jul. 3, 2023

(65) Prior Publication Data

US 2024/0014347 A1 Jan. 11, 2024

(30) Foreign Application Priority Data

Jul. 5, 2022 (CN) ......................... 202210790720.7
Aug. 24, 2022 (CN) ......................... 202211016122.0

(51) Int. Cl.

*H10H 20/815* (2025.01)
*H10H 20/01* (2025.01)
*H10H 20/82* (2025.01)
*H10H 20/824* (2025.01)

(52) U.S. Cl.

CPC ........ *H10H 20/815* (2025.01); *H10H 20/013* (2025.01); *H10H 20/82* (2025.01); *H10H 20/824* (2025.01)

(58) Field of Classification Search

CPC .... H10H 20/013; H10H 20/82; H10H 20/833; H10H 20/018
See application file for complete search history.

(56) References Cited

U.S. PATENT DOCUMENTS

2020/0203570 A1* 6/2020 Chen .................... H10H 20/817
2020/0220047 A1* 7/2020 Lee ..................... H01L 25/0753
2021/0066551 A1* 3/2021 Xiong .................. H10H 20/018
2023/0352454 A1* 11/2023 Nagao .................. H10H 20/855

* cited by examiner

*Primary Examiner* — Brian Turner
(74) *Attorney, Agent, or Firm* — Muncy, Geissler, Olds & Lowe, P.C.

(57) ABSTRACT

A light-emitting device includes a semiconductor substrate, an epitaxial structure that has a first surface facing the semiconductor substrate and a second surface opposite to the first surface, and a transparent bonding structure that is disposed between the first surface and the semiconductor substrate. The transparent bonding structure has a first bonding surface facing the first surface of the epitaxial structure and a second bonding surface opposite to the first bonding surface, and has a slit extending from the first bonding surface toward the second bonding surface and terminating at a position that is a distance away from the second bonding surface. A method for manufacturing a light-emitting device is also provided.

15 Claims, 6 Drawing Sheets

LIGHT-EMITTING DEVICE AND METHOD FOR MANUFACTURING THE SAME

CROSS-REFERENCE TO RELATED APPLICATION

This application claims priorities to Chinese Invention Patent Application No. 202210790720.7, filed on Jul. 5, 2022, and Chinese Invention Patent Application No. 202211016122.0, filed on Aug. 24, 2022, the disclosures of which are each incorporated herein by reference in their entireties.

FIELD

The disclosure relates to a light emitting device and a method for manufacturing the same.

BACKGROUND

A light-emitting diode (LED) is a semiconductor light-emitting device that is typically made of a semiconductor material such as GaN, GaAs, GaP, GaAsP, etc., and has a PN junction for light emitting. In forward bias, electrons in the semiconductor light-emitting device may travel from an N-region to a P-region and holes may travel from the P-region to the N-region through the PN junction. When the electrons recombine with the holes, energy is released so that the LED emits light. LEDs exhibit advantages such as high light-emitting intensity, fast response rate, small size, long lifespan, etc., and have been widely used in various applications.

In an existing light-emitting device, an epitaxial structure is generally bonded to a substrate via a bonding technique. Specifically, the bonding technique usually utilizes a transparent oxide material to form a bonding layer for bonding the epitaxial structure to the substrate, and is widely applied in manufacturing of the LEDs. However, during an annealing process in the manufacturing of the LEDs, unexpected cracking and delamination may occur at an interface between the epitaxial structure and the transparent oxide material, which may in turn affect reliability of the LEDs. Therefore, prevention of unexpected cracking and delamination during the manufacturing of the LEDs has become one of the technical challenges that needs to be addressed urgently by those skilled in the art.

SUMMARY

Therefore, an object of the disclosure is to provide a light emitting device and a method for manufacturing the same that can alleviate at least one of the drawbacks of the prior art.

According to the disclosure, a light emitting device includes a semiconductor substrate, an epitaxial structure that has a first surface facing the semiconductor substrate and a second surface opposite to the first surface, and a transparent bonding structure that is disposed between the first surface and the semiconductor substrate. The transparent bonding structure has a first bonding surface facing the first surface of the epitaxial structure and a second bonding surface opposite to the first bonding surface, and has a slit extending from the first bonding surface toward the second bonding surface and terminating at a position that is a distance away from the second bonding surface.

According to the disclosure, a method for manufacturing a light-emitting device includes: providing an epitaxial structure on a growth substrate, the epitaxial structure including a first semiconductor layer, an active layer, and a second semiconductor layer that are sequentially disposed on the growth substrate in such order; roughening a surface of the epitaxial structure that is distal from the growth substrate so as to form a roughened first surface of the epitaxial structure; forming a transparent bonding structure on the roughened first surface of the epitaxial structure, the transparent bonding structure being formed with a slit extending from the roughened first surface and not penetrating the transparent bonding structure; bonding the epitaxial structure to a semiconductor substrate through the transparent bonding structure; and removing the growth substrate to expose a surface of the epitaxial structure that is opposite to the roughened first surface.

The light-emitting device according to the present disclosure may have reduced internal stress in the transparent oxide material of the bonding structure by providing a slit in the transparent bonding structure, which effectively reduces cracking and delamination at an interface between the epitaxial structure and the transparent bonding structure caused by thermal mismatch during an annealing process in the manufacturing of the light-emitting device.

Other features and advantages of the present disclosure are set forth in the following description.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
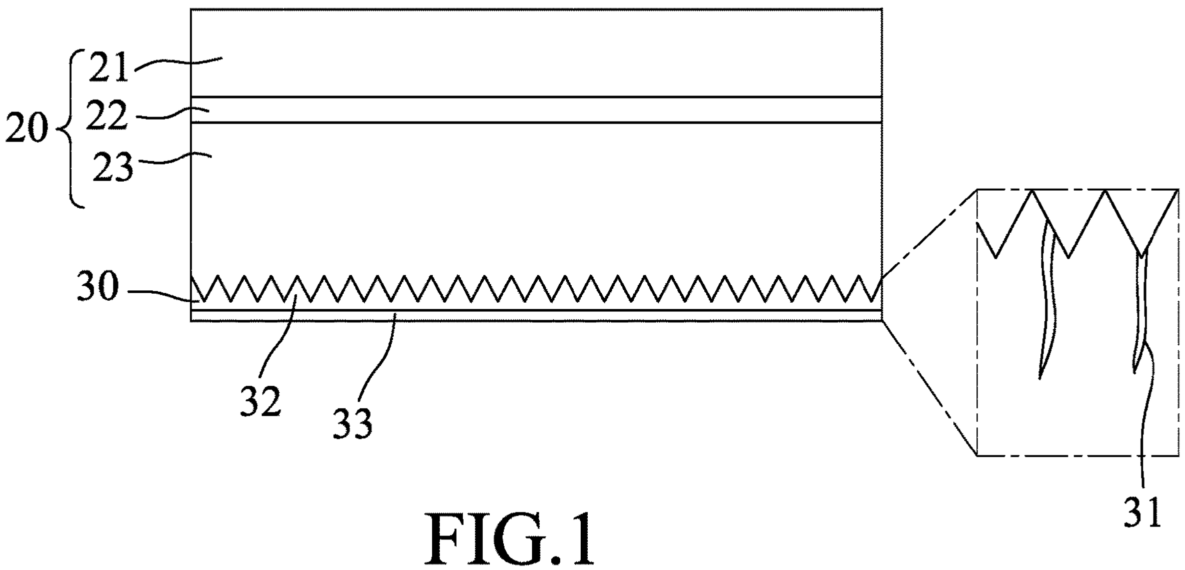
FIG. 1 is a structural schematic view of a light-emitting device according to one embodiment of the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as “top,” “bottom,” “upper,” “lower,” “on,” “above,” “over,” “downwardly,” “upwardly” and the like may be used throughout the disclosure while making reference to the features as illustrated in the drawings. The features may be oriented differently (e.g., rotated 90 degrees or at other orientations) and the spatially relative terms used herein may be interpreted accordingly. Furthermore, the terms “first,” “second,” and other ordinal numbers used in connection with technical features are solely for descriptive purposes, and should not be understood as indicating or implying relative importance of the technical features or implying the quantity of the technical features. The quantity of any such technical feature may be one or more than one. In the description of the present invention, unless otherwise specified, the term “multiple,” “plural,” or “a plurality of” means two or more. Additionally, the phrase “comprising a technical feature” and its variations mean “including at least such technical feature,” and does not rule out the possibility of including other technical features.

Figure 2:
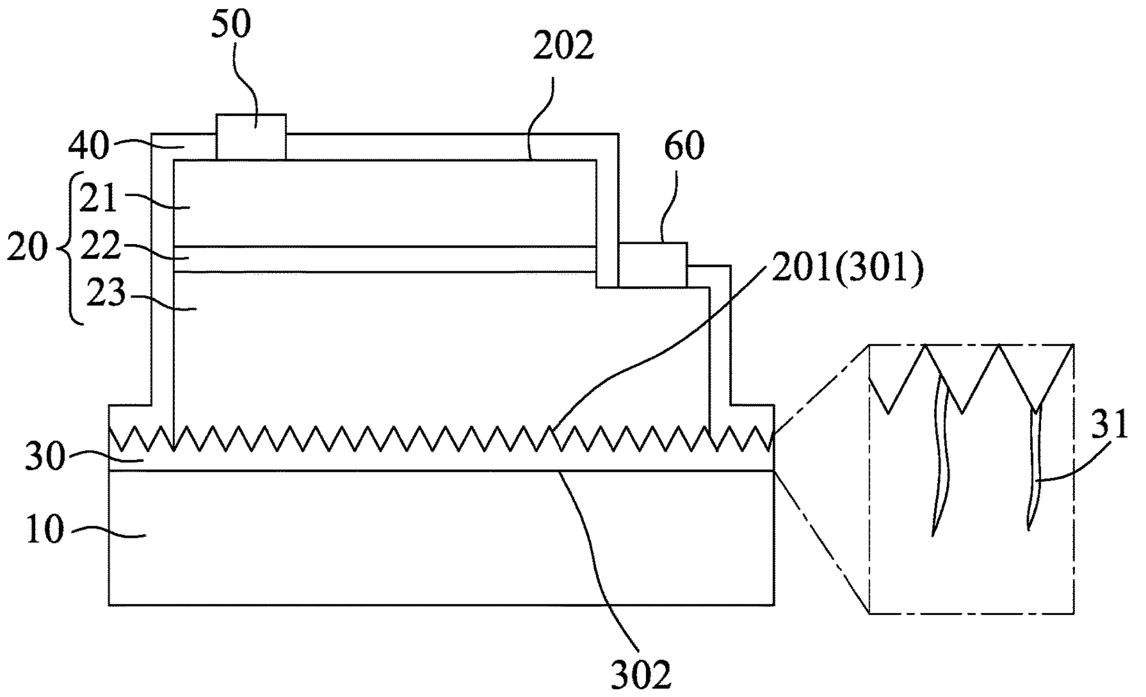
FIG. 2 is a structural schematic view of a face-up type or flip chip light-emitting device according to the present disclosure.

Referring to FIGS. 1 and 2, a light-emitting device according to an embodiment of the present disclosure includes a semiconductor substrate 10, an epitaxial structure 20, and a transparent bonding structure 30.

The semiconductor substrate 10 has a sufficient mechanical strength to support the epitaxial structure 20, and allows light emitted from the epitaxial structure 20 to pass therethrough. Specifically, the semiconductor substrate 10 may be a transparent substrate and includes an inorganic material or a Group III-V semiconductor material. The inorganic material includes, e.g., silicon carbide (SiC), germanium (Ge), sapphire, lithium aluminate ($LiAlO_2$), zinc oxide (ZnO), glass, or quartz. The Group III-V semiconductor material includes, e.g., indium phosphide (InP), gallium phosphide (slit), gallium nitride (GaN), or aluminum nitride (AlN) material.

The epitaxial structure 20 has a first surface 201 and a second surface 202 opposite to the first surface 201. The epitaxial structure 20 may be formed by existing epitaxy methods, e.g., metal organic chemical vapor deposition (MOCVD), molecular beam epitaxy (MBE), or hydride vapor phase epitaxy (HVPE), etc.

In this embodiment, the transparent bonding structure 30 is disposed between the first surface 201 of the epitaxial structure 20 and the semiconductor substrate 10. In addition, the transparent bonding structure 30 is formed on the first surface 201 of the epitaxial structure 20 by a chemical deposition process or a physical deposition process, e.g., chemical vapor deposition or vacuum evaporation. In certain embodiments, the transparent bonding structure 30 has a thickness ranging from 2 μm to 5 μm.

The transparent bonding structure 30 includes at least one bonding layer that is made of a transparent oxide material. Specifically, the transparent bonding structure 30 may be a single-layered structure or a multi-layered structure as the number of bonding layers may vary as required. For example, the transparent bonding structure 30 may include a first bonding layer 32 proximate to the epitaxial structure 20 and a second bonding layer 33 away from the epitaxial structure 20. The first bonding layer 32 and the second bonding layer 33 are laminated on the epitaxial structure 20 in such order to form the transparent bonding structure 30. In certain embodiments of the present disclosure, the first bonding layer 32 is in contact with the epitaxial structure 20, and the second bonding layer 33 is in contact with the semiconductor substrate 10. In some embodiments, the first bonding layer 32 is a transparent conductive layer that may serve as a current spreading layer, and the second bonding layer 33 is a bonding material layer that may function to bond the first bonding layer 32 to the semiconductor substrate 10. The first bonding layer 32 is made of a transparent oxide material that is the same as or different from that of the second bonding layer 33.

In some embodiments, the transparent bonding structure 30 may include an insulating material, a conductive material, or both. The insulating material includes, but is not limited to, aluminum oxide ($Al_2O_3$), silicon oxide ($SiO_x$), titanium oxide ($TiO_2$), tantalum oxide ($Ta_2O_5$), silicon nitride ($SiN_x$), etc. The conductive material includes, but is not limited to, indium tin oxide (ITO), indium oxide (InO), tin oxide (SnO), cadmium tin oxide (CTO), antimony tin oxide (ATO), aluminum zinc oxide (AZO), zinc tin oxide (ZTO), zinc oxide (ZnO), indium zinc oxide (IZO), gallium zinc oxide (GZO), or combinations thereof. When the transparent bonding structure 30 is made of a conductive material and is in contact with the epitaxial structure 20, the transparent bonding structure 30 may function as a current spreading layer, and performance of current spreading and uniformity of distribution of current may therefore be improved.

Referring to FIG. 2, the transparent bonding structure 30 has a first bonding surface 301 that is in contact with the epitaxial structure 20 and a second bonding surface 302 that is in contact with the semiconductor substrate 10, and a slit 31 is extended from the first bonding surface 301 toward the second bonding surface 302 and terminates at a position that is a distance (X) away from the second bonding surface 302. With the foregoing configuration, bonding quality may be assured, while yield of the light-emitting device may be effectively improved. Furthermore, it has been demonstrated that inclusion of the slit 31 in the transparent bonding structure 30 made of the transparent oxide material may effectively reduce internal stress in the transparent oxide material, and thus, cracking and delamination at an interface between the epitaxial structure 20 and the transparent bonding structure 30 due to thermal mismatch during a subsequent annealing process may be alleviated, thereby further enhancing reliability of the light-emitting device.

In some embodiments, the first surface 201 of the epitaxial structure 20 is a roughened surface, i.e., the surface of the epitaxial structure 20 that is near the semiconductor substrate 10 is a roughened surface. The roughened first surface 201 has a regular or an irregular pattern, and has a maximum depth ranging from 0.5 μm to 1.0 μm. With such configuration, total reflection of light emitted from the epitaxial structure 20 through the transparent bonding structure 30 and the first surface of the epitaxial structure 20 may be reduced.

The slit 31 may be formed during vapor depositing of the transparent bonding structure 30 on the roughened first surface 201. In certain embodiments, a plurality of slits 31 extending from the first bonding surface 301 toward the second bonding surface 302 are formed in the transparent bonding structure 30. Specifically, without affecting the bonding strength and bonding stability of the transparent bonding structure 30, a density of the slits 31 may be appropriately managed by controlling roughness of the roughened first surface 201 of the epitaxial structure 20 as required. The shape, height, size of the slits 31 may vary based on adjustment of process parameters for forming the transparent bonding structure 30 and the roughened first surface 201 of the epitaxial structure 20. The slits 31 may be optimized to be more conducive to reducing the internal stress.

In this embodiment, after formation of the transparent bonding structure 30, a polishing process is conducted to improve smoothness of the second bonding surface 302 of the transparent bonding structure 30. In certain embodiments, the transparent bonding structure 30 has a surface roughness (Ra) not greater than 10 nm, and a removal thickness of the transparent bonding structure 30 during the polishing process is not smaller than 0.8 μm and not greater than 1.5 μm.

Furthermore, the transparent bonding structure 30 has a thickness that is more than enough to prevent the slit 31 from penetrating the transparent bonding structure 30. In a certain embodiment, the distance (X) of the slit 31 away from the second bonding surface 302 of the transparent bonding structure 30 is not smaller than 0.8 μm.

As mentioned above, the transparent bonding structure 30 may include at least two bonding layers which are stacked on one another and each of which is made of the transparent oxide material. Moreover, a density of one of the at least two bonding layers which is in direct contact with the epitaxial structure 20 is greater than a density of one of the at least two bonding layers which is not in direct contact with the epitaxial structure 20. In such configuration, the one of the at least two bonding layer which is in direct contact with the epitaxial structure 20 has greater adhesion property, so as to ensure the bonding strength between the epitaxial structure 20 and the semiconductor substrate 10, thereby maintaining the desired bonding strength and stability. Consequently, the reliability of the light-emitting device may be improved.

For example, in the embodiment where the transparent bonding structure 30 includes the first bonding layer 32 and the second bonding layer 33 which are made of the transparent oxide material, the first bonding layer 32, which is in contact with the epitaxial structure 20, has a density that is greater than that of the second bonding layer 33 which is in contact with the semiconductor substrate 10. The first bonding layer 32 and the second bonding layer 33 may be formed by a plasma enhanced chemical vapor deposition process. The adhesion of the first and second bonding layers 32, 33 may be adjusted by changing a plasma excitation frequency during the plasma enhanced chemical vapor deposition process. In some embodiments, the first bonding layer 32 and the second bonding layer 33 may be made of the same or different materials.

In certain embodiments, the first bonding layer 32 has a thickness that is smaller than that of the second bonding layer 33. In certain embodiments, a thickness ratio of the first bonding layer 32 to the second bonding layer 33 ranges from 1:100 to 1:5 so as to provide the bonding strength required for the following processing.

The epitaxial structure 20 includes a first semiconductor layer 21, a second semiconductor layer 23, and an active layer 22 disposed between the first semiconductor layer 21 and the second semiconductor layer 23. The first semiconductor layer 21 and the second semiconductor layer 23 have different conductivity types, electric properties, or polarity, and are doped with different dopants so as to provide electrons or holes.

In the present embodiment, the first semiconductor layer 21 may be a P-type semiconductor layer which may provide holes to the active layer 22 when powered. In some embodiments, the first semiconductor layer 21 includes a P-type doped AlInP layer, and is doped with an element such as Mg, C, etc. In some embodiments, the first semiconductor layer 21 includes a P-type doped nitride layer. The P-type doped nitride layer may include one or more Group II elements as P-type impurities. The P-type impurities may include one of Mg, Zn, Be, or combinations thereof. The first semiconductor layer 21 may be a single-layered structure or a multi-layered structure. Layers of the multi-layer structure may have different composites.

The active layer 22 may be a quantum well structure. In some embodiments, the active layer 22 may be a multiple quantum well structure. In some embodiments, the multiple quantum well structure includes quantum well layers and quantum barrier layers that are alternately arranged in a repetitive manner. In other words, the multiple quantum well structure includes a plurality of layer units each being composed of one of the quantum well layers and one of the quantum barrier layers. The layer units of the multiple quantum well structure may each be AlGaInP/GaInP, GaN/AlGaN, InAlGaN/InAlGaN, or InGaN/AlGaN. In addition, composites and thicknesses of the well layers in the active layer 22 determine a wavelength of the light generated by the epitaxial structure 20. To improve luminous efficiency of the active layer 22, a thickness of the quantum well structure, the number and thicknesses of the layer units and/or other features of the active layer 22 may be adjusted.

The second semiconductor layer 23 may be an N-type semiconductor layer, which may provide electrons to the active layer 22 when powered. Furthermore, the second semiconductor layer 23 includes an N-type doped nitride layer, phosphide layer, or arsenide layer. The N-type doped nitride layer, phosphide layer, or arsenide layer may include one or more N-type impurities of Group IV elements. According to the present disclosure, the N-type impurities may include one of Si, Ge, Sn, or combinations thereof, but not limited thereto. In some other embodiments, the second semiconductor layer 23 may be a single-layered structure or a multi-layered structure.

It should be noted that the configuration of the epitaxial structure 20 is not limited to the described above, and that other functional layer that may improve the performance of the light-emitting device may be added based on actual requirements.

Referring to FIG. 2, the light-emitting device further includes a first electrode structure 50 and a second electrode structure 60 that are disposed on the second surface 202 of the epitaxial structure 20, and an insulating protective layer 40. The insulating protective layer 40 at least covers the second surface 202 and a sidewall of the epitaxial structure 20. In certain embodiments, the insulating protective layer 40 is a transparent insulating layer that is made of, e.g., $Al_2O_3$, $TiO_2$, $SiO_2$, SiN, or combinations thereof.

In the embodiment of a face-up type or a flip chip light-emitting device as shown in FIG. 2, the insulating protective layer 40 is provided with separate openings located corresponding to the first electrode structure 50 and the second electrode structure 60, respectively. Specifically, the first electrode structure 50, through the corresponding opening in the insulating protective layer is electrically connected to the first semiconductor layer 21. The second electrode structure 60, through the corresponding opening in the insulating protective layer 40, is electrically connected to the second semiconductor layer 23.

In some embodiments, the light-emitting device is, but not limited to, a red light-emitting device or an infrared light-emitting device.

Figure 3:
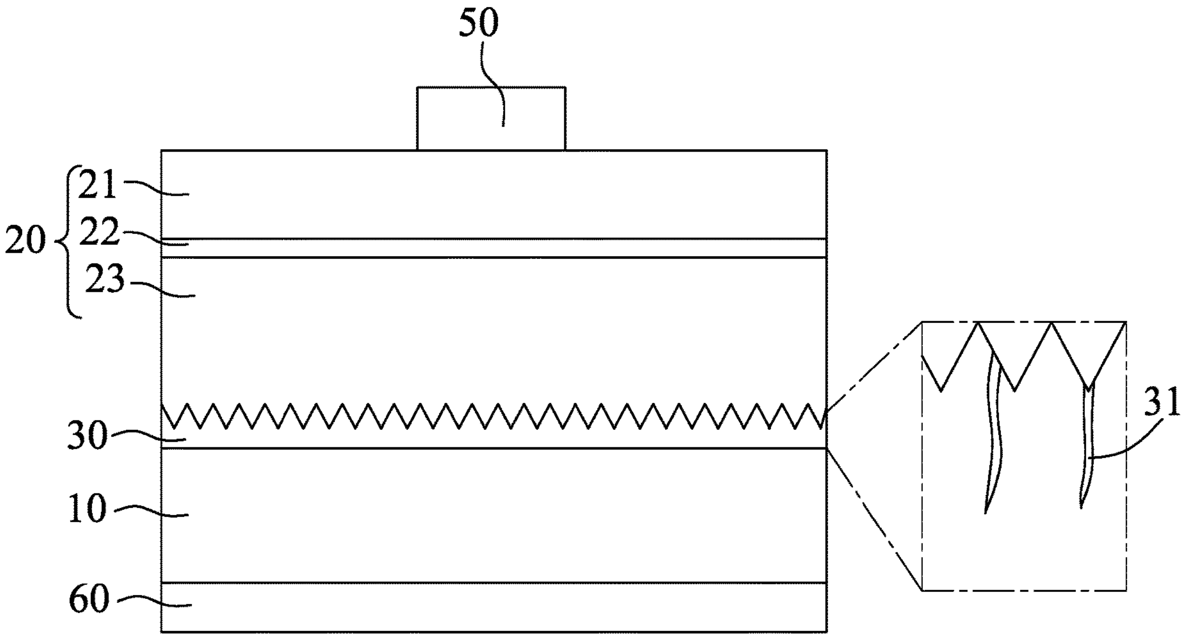
FIG. 3 is a structural schematic view of a vertical type light-emitting device according to the present disclosure.

It should be noted that the light-emitting device that employs the oxide material as the bonding layer according to the present disclosure may either be the face-up type or the flip chip light-emitting device as shown in FIG. 2, and may also be a vertical type light-emitting device as shown in FIG. 3. Furthermore, the light-emitting device may be a small size flip chip light-emitting diode, specifically a mini flip chip light-emitting diode. The mini flip chip light-emitting diode may have a size of smaller than 90,000 $\mu m^2$ with a length and a width ranging from 100 μm to 300 μm and a height ranging from 40 μm to 100 μm.

FIGS. 4 to 11 are structural schematic views illustrating a method for manufacturing a light-emitting device according to one embodiment of the present disclosure.

Figure 4:
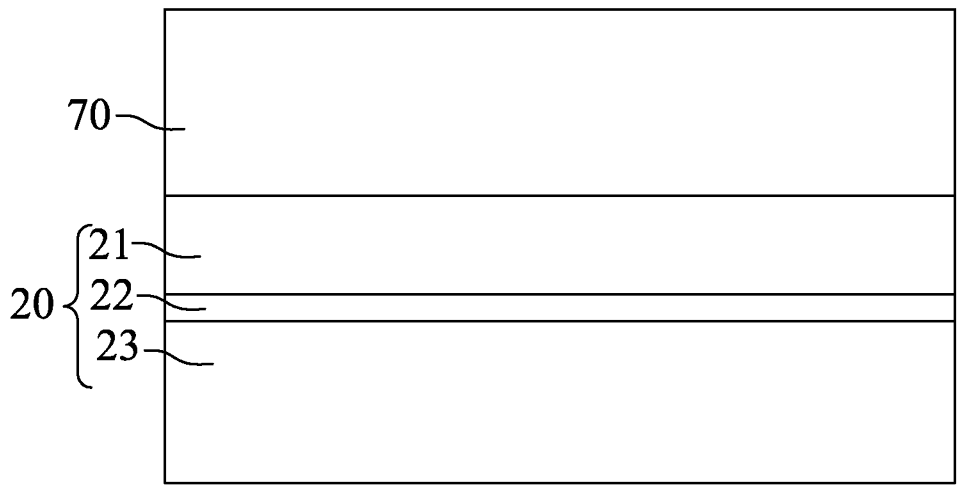
FIGS. 4 to 11 are structural schematic views illustrating a method for manufacturing a light-emitting device according to one embodiment of the present disclosure.

Referring to FIG. 4, the epitaxial structure 20 is provided on the growth substrate 70. The epitaxial structure 20 includes the first semiconductor layer 21, the active layer 22, and the second semiconductor layer 23. The epitaxial structure 20 may be grown on the growth substrate 70 by utilizing existing known methods, e.g., metal organic chemical vapor deposition (MOCVD), molecular beam epitaxy (MBE), or hydride vapor phase epitaxy (HYPE), etc.

Figure 5:
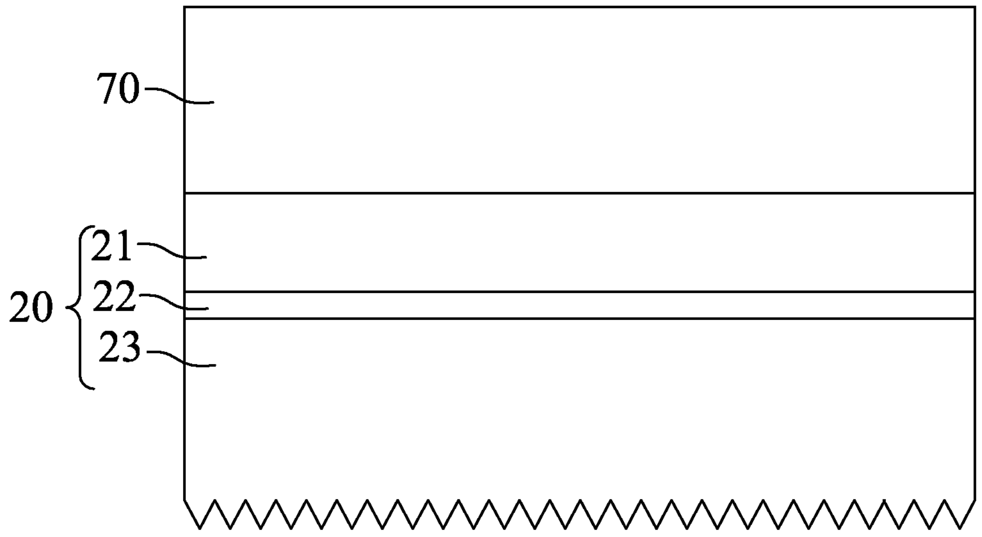

Referring to FIG. 5, a surface of the epitaxial structure 20 that is distal from the growth substrate 70 is subjected to a roughening process, so as to form the roughened first surface 201 of the epitaxial structure 20. The roughening process may be carried out by, for example, etching or mechanical polishing. The roughened first surface 201 has a regular or an irregular pattern that has the maximum depth ranging from 0.5 μm to 1.0 μm.

Figure 6:
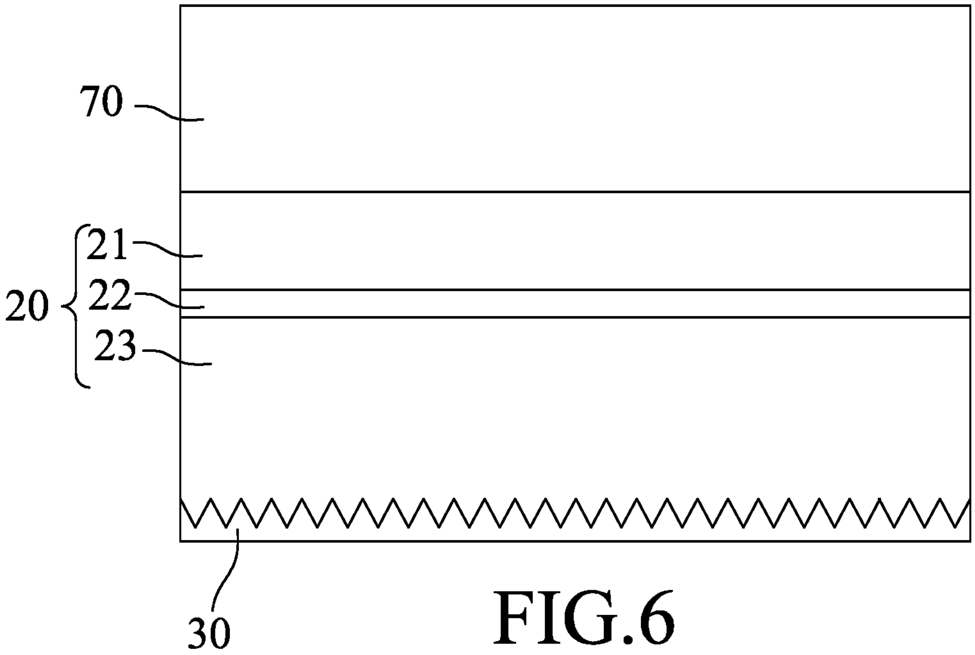

Referring to FIG. 6, the transparent bonding structure 30 is formed on the roughened first surface 201 of the epitaxial structure 20, for example, by a coating process. Simultaneously, the slit 31 is also created in the transparent bonding structure 30. The slit 31 extends from the roughened first surface 201 and does not penetrate the transparent bonding structure 30.

Figure 7:
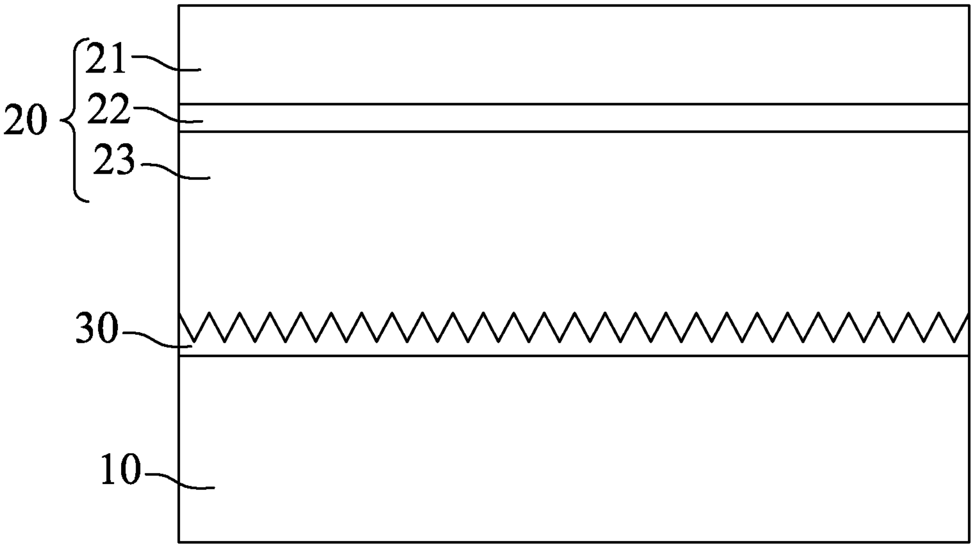

Referring to FIG. 7, the epitaxial structure 20 is bonded to the semiconductor substrate 10 through the transparent bonding structure 30, and the growth substrate 70 is removed via, for example, a polishing process so as to expose a surface of the epitaxial structure 20 that is opposite to the roughened first surface 201. In certain embodiments, before bonding the epitaxial structure 20 to the semiconductor substrate 10, a surface of the transparent bonding structure 30 that is distal from the epitaxial structure 20 is polished with the removal thickness ranging from 0.8 μm to 1.5 μm. The polished surface has a surface roughness (Ra) not greater than 10 nm.

The structure obtained from the above processes may be used in the manufacturing of the face-up type light-emitting device or the flip chip light-emitting device, as well as the vertical type light-emitting device, and further processes may be incorporated based on actual structure of the light-emitting device.

Further processes of the manufacturing of the face-up type or flip chip light-emitting device will be described below as an example.

Figure 8:
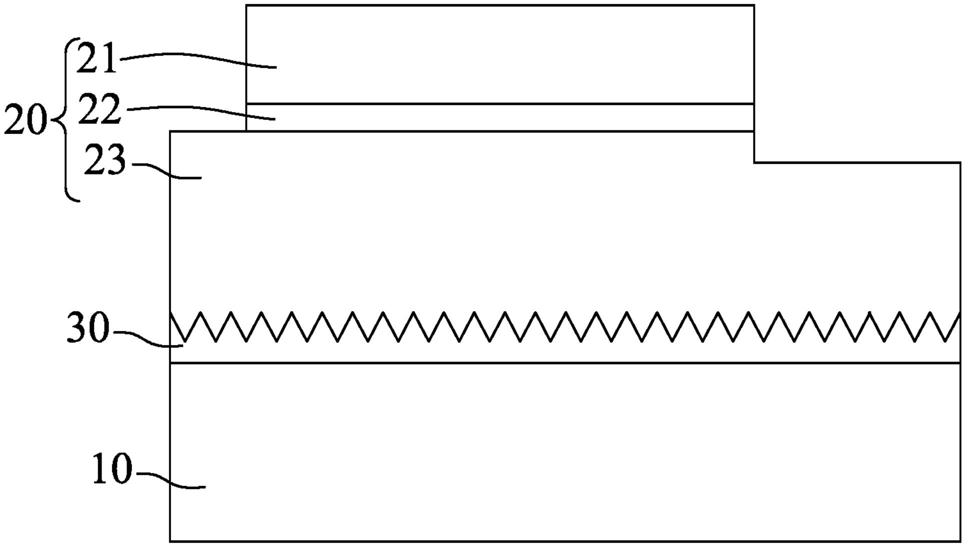
Figure 9:
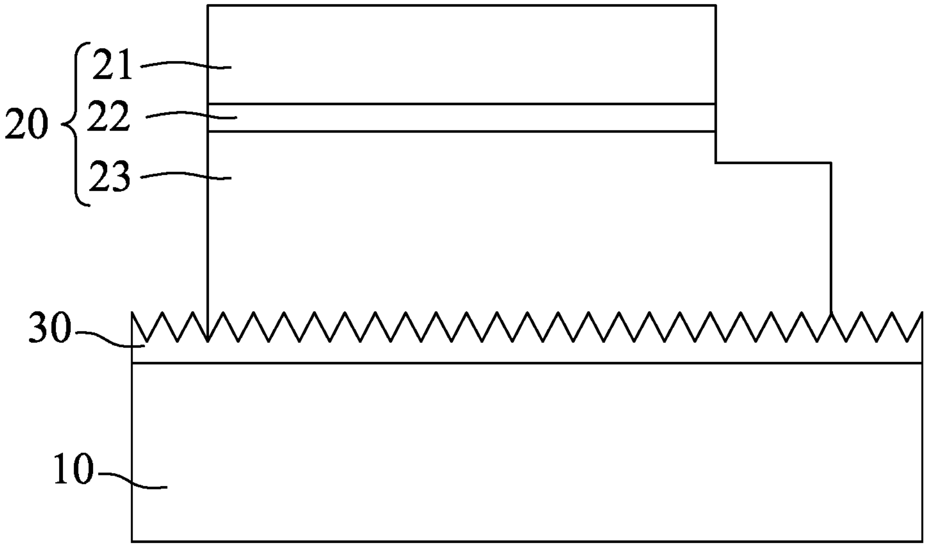

Referring to FIGS. 8 and 9, a portion of the first semiconductor layer 21 and a portion of the active layer 22 are etched away using a mask to expose a surface of the second semiconductor layer 23. A part of the epitaxial structure 20 is removed to expose a portion of the transparent bonding structure 30 so as to form a scribe lane.

Figure 10:
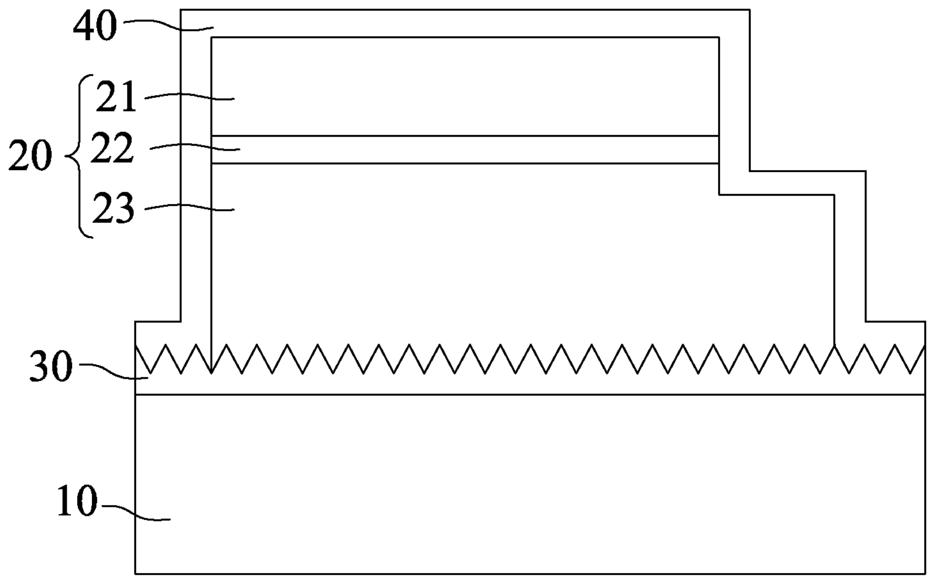

Referring to FIG. 10, the insulating protective layer 40 is formed on and covers the exposed second surface 202 and the sidewall of the epitaxial structure 20 and the scribe lane.

Figure 11:
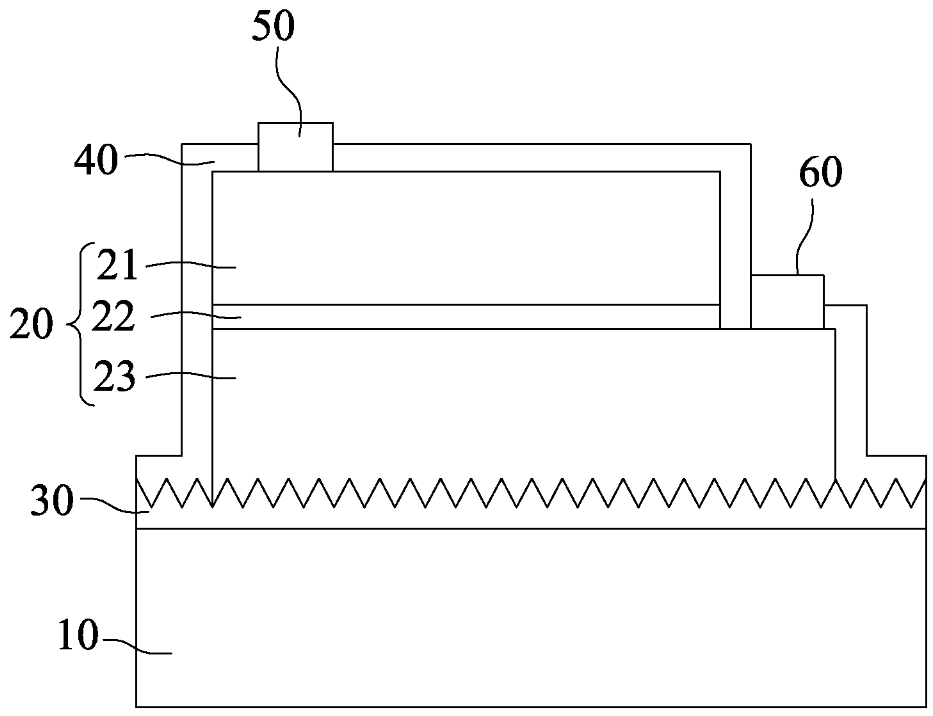

Referring to FIG. 11, the openings are formed on the insulating protective layer 40 corresponding in positions to the first semiconductor layer 21 and the exposed second semiconductor layer 23. The first electrode structure 50 and the second electrode structure 60 are formed on the insulating protective layer and extend into the openings to be respectively connected to the first semiconductor layer 21 and the second semiconductor layer 23.

In summary, compared to the existing techniques, the light-emitting device according to the present disclosure has reduced internal stress in the transparent oxide material by providing the slit 31 in the transparent bonding structure 30. Such configuration may effectively reduce the cracking and delamination at the interface between the epitaxial structure 20 and the transparent bonding structure 30 caused by the thermal mismatch during the annealing process.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device, comprising:

a semiconductor substrate;

an epitaxial structure that has a first surface facing said semiconductor substrate and a second surface opposite to said first surface; and a transparent bonding structure that is disposed between said first surface and said semiconductor substrate, that has a first bonding surface facing said first surface of said epitaxial structure and a second bonding surface opposite to said first bonding surface, and that has a slit extending from said first bonding surface toward said second bonding surface and terminating at a position spaced apart from said second bonding surface, wherein said transparent bonding structure includes at least two bonding layers which are stacked on one another and each of which is made of a transparent oxide material, a density of one of said at least two bonding layers which is in direct contact with said epitaxial structure is greater than a density of one of said at least two bonding layers which is not in direct contact with said epitaxial structure.

2. The light-emitting device according to claim 1, wherein said position is spaced apart from said second boding surface by a distance not smaller than 0.8 μm.

3. The light-emitting device according to claim 1, wherein said first surface is a roughened surface having a regular or an irregular pattern that has a maximum depth ranging from 0.5 μm to 1.0 μm.

4. The light-emitting device according to claim 1, wherein said transparent bonding structure includes a first bonding layer that is the one of said at least two bonding layers which is in direct contact with said epitaxial structure, and a second bonding layer that is stacked on said first bonding layer and that is in contact with said semiconductor substrate, the density of said first bonding layer being greater than that of said second bonding layer.

5. The light-emitting device according to claim 4, wherein the transparent oxide material of said first bonding layer is same as that of said second bonding layer.

6. The light-emitting device according to claim 4, wherein the transparent oxide material of said first bonding layer is different from that of said second bonding layer.

7. The light-emitting device according to claim 4, wherein a thickness ratio of said first bonding layer to said second bonding layer ranges from 1:100 to 1:5.

8. The light-emitting device according to claim 1, wherein said transparent bonding structure has a thickness ranging from 2 μm to 5 μm.

9. The light-emitting device according to claim 1, wherein said transparent bonding structure is made of an insulating material.

10. The light-emitting device according to claim 1, wherein said second bonding surface of said transparent bonding structure is a polished surface with a surface roughness not greater than 10 nm, and is polished with a removal thickness of not smaller than 0.8 μm and not greater than 1.5 μm.

11. The light-emitting device according to claim 1, further comprising an insulating protective layer that covers said second surface and a sidewall of said epitaxial structure.

12. The light-emitting device according to claim 11, wherein said insulating protective layer is a transparent insulating layer.

13. The light-emitting device according to claim 1, further comprising a first electrode structure and a second electrode structure that are located on said second surface of said epitaxial structure, wherein said epitaxial structure includes a first semiconductor layer, a second semiconductor layer, and an active layer disposed between said first semiconductor layer and said second semiconductor layer, said first electrode structure is electrically connected to said first semiconductor layer, and said second electrode structure is electrically connected to said second semiconductor layer.

14. The light-emitting device according to claim 1, wherein said light-emitting device is a red light-emitting device or an infrared light-emitting device.

15. The light-emitting device according to claim 1, wherein said transparent bonding structure is made of a conductive material.

* * * * *